(12) United States Patent
Kaneyama

(10) Patent No.: US 11,640,894 B2
(45) Date of Patent: May 2, 2023

(54) CHARGED PARTICLE BEAM APPARATUS AND CONTROL METHOD OF CHARGED PARTICLE BEAM APPARATUS

(71) Applicant: JEOL Ltd., Tokyo (JP)

(72) Inventor: Toshikatsu Kaneyama, Tokyo (JP)

(73) Assignee: JEOL Ltd., Tokyo (JP)

( * ) Notice: Subject to any disclaimer, the term of this patent is extended or adjusted under 35 U.S.C. 154(b) by 520 days.

(21) Appl. No.: 16/682,421

(22) Filed: Nov. 13, 2019

(65) Prior Publication Data

US 2020/0168431 A1 May 28, 2020

(30) Foreign Application Priority Data

Nov. 26, 2018 (JP) .............................. JP2018-220158

(51) Int. Cl.
*H01J 37/141* (2006.01)

(52) U.S. Cl.
CPC ....... *H01J 37/141* (2013.01); *H01J 2237/141* (2013.01)

(58) Field of Classification Search
CPC .......... H01J 37/10; H01J 37/14; H01J 37/141; H01J 37/145; H01J 2237/10; H01J 2237/14; H01J 2237/141; H01J 2237/145
See application file for complete search history.

(56) References Cited

U.S. PATENT DOCUMENTS

| 4,345,152 | A | * | 8/1982 | Gerlach | .................. | H01J 37/02 |
| | | | | | | 250/396 ML |
| 5,442,182 | A | * | 8/1995 | Kubo | .................... | H01J 37/141 |
| | | | | | | 250/398 |
| 6,852,982 | B1 | | 2/2005 | Bierhoff et al. | | |
| 2007/0228276 | A1 | * | 10/2007 | Makino | ................ | H01J 37/265 |
| | | | | | | 250/310 |

FOREIGN PATENT DOCUMENTS

| JP | S5755043 | A | | 4/1982 | | |
| JP | 419664 | B2 | | 3/1992 | | |
| JP | 0935897 | A | * | 2/1997 | ............... | H05H 7/04 |
| JP | 2009176542 | A | | 8/2009 | | |

OTHER PUBLICATIONS

Office Action issued in JP2018220158 dated Feb. 16, 2021.
Communication of a notice of opposition issued in EP19210689.6 dated Feb. 14, 2022.

* cited by examiner

*Primary Examiner* — David E Smith
(74) *Attorney, Agent, or Firm* — The Webb Law Firm

(57) ABSTRACT

A charged particle beam apparatus that includes a magnetic lens having an electromagnetic coil composed of a pair of coils includes: a setting unit that sets a maximum current value that defines a maximum magnetomotive force of the magnetic lens based on an operation of a user; and a current control unit that controls a current to be supplied to each of the pair of coils within a current range corresponding to a set maximum current value so that thermal power consumed by the electromagnetic coil is maintained constant at thermal power corresponding to the set maximum current value.

3 Claims, 2 Drawing Sheets

CHARGED PARTICLE BEAM APPARATUS AND CONTROL METHOD OF CHARGED PARTICLE BEAM APPARATUS

CROSS-REFERENCE TO RELATED APPLICATION

This application claims priority to Japanese Patent Application No. 2018-220158 filed Nov. 26, 2018, the disclosure of which is hereby incorporated by reference in its entirety.

BACKGROUND OF THE INVENTION

The present invention relates to a charged particle beam apparatus and a control method thereof.

JP-B-4-19664 discloses a magnetic lens that has a pair of auxiliary coils, and the direction and size of a current flowing through each of the auxiliary coils can separately be controlled. This magnetic lens maintains thermal power consumption within a certain range by maintaining an absolute value of the algebraic sum of the currents flowing through the pair of the auxiliary coils constant. Even if observation conditions (acceleration voltage and observation magnification) are changed, an electron microscope using such a magnetic lens can maintain the amount of heat generated by the electromagnetic coil constant and prevent the temperature of peripheral members from varying so that occurrence of a drift (movement of electron beams and transmission electron images) caused by a temperature change can be suppressed.

In actual application of the electron microscope, the maximum output of the apparatus is not always needed, and in many cases, the apparatus is used under limited conditions. For example, while many products of scanning electron microscopes have a maximum acceleration voltage of 30 kV, the scanning electron microscopes are not necessarily used at the maximum acceleration voltage. In many cases, the scanning electron microscopes are operated at a smaller acceleration voltage such as 15 kV or 5 kV. This is because, by reducing the acceleration voltage, a penetration distance of an electron beam into a specimen becomes smaller and capabilities of obtaining information near the surface and detecting micro objects are improved. In addition, there are cases where the acceleration voltage is reduced in order to suppress the degree of specimen breakage caused by electron beam irradiation. When the low acceleration voltage is applied, since the energy of the electron beam is lowered, the necessary strength of the magnetic lens needs to be weakened to correspond to the lowered electron beam energy. When the acceleration voltage is U, a current applied to the coils of the magnetic lens is generally proportional to $U^{1/2}$. With the above conventional magnetic lens, even when the magnetic lens is operated at a low acceleration voltage, since the current supplied to the auxiliary coils is controlled to maintain thermal power consumption corresponding to a maximum magnetomotive force of the magnetic lens, unnecessary wasteful power is consumed in a routine operation at the low acceleration voltage.

While the amount of heat generated by the electromagnetic coil is maintained constant to secure the stability, the temperature of the coil portion is still higher than that of the peripheral members. Thus, when the apparatus is started from a state in which the power of the apparatus is off (a state in which the temperature of the coil is close to that of the peripheral members and the surrounding atmosphere) and the current is applied to the coil, joule heat causes the temperature of the coil to rise, and eventually, the temperature of the coil and the temperature of the peripheral members reach equilibrium and thermal stability is maintained thereafter. The temperature of the coil and the peripheral members continues to rise until such equilibrium is reached, and a drift occurs during this temperature rise. Consequently, when the apparatus is first started, so-called "drift standby time" needs to be taken until the drift becomes equal to or less than a permissible amount. The drift standby time is several minutes to several tens of minutes or more, and the higher the temperature at which the equilibrium is reached is, the longer the drift standby time takes. As described above, the conventional magnetic lens consumes unnecessary wasteful power, and unnecessarily large amount of heat is generated. Namely, the conventional magnetic lens causes the temperature of the coil and the peripheral members to rise more than necessary, which results in creating longer drift standby time than necessary when the apparatus is first started.

The invention is made in view of the above problems. According to several aspects of the invention, there are provided a charged particle beam apparatus capable of suppressing unnecessary power consumption and shortening time needed to reach thermal equilibrium upon the start of the apparatus and a control method thereof.

SUMMARY OF THE INVENTION

According to a first aspect of the invention, there is provided a charged particle beam apparatus that includes a magnetic lens having an electromagnetic coil composed of a pair of coils, the charged particle beam apparatus including:

a setting unit that sets a maximum current value that defines a maximum magnetomotive force of the magnetic lens based on an operation of a user; and a current control unit that controls a current to be supplied to each of the pair of coils within a current range corresponding to a set maximum current value so that thermal power consumed by the electromagnetic coil is maintained constant at thermal power corresponding to the set maximum current value.

According to a second aspect of the invention, there is provided a control method of a charged particle beam apparatus that includes a magnetic lens having an electromagnetic coil composed of a pair of coils, the control method including:

a setting step of setting a maximum current value that defines a maximum magnetomotive force of the magnetic lens based on an operation of a user; and a current control step of controlling a current to be supplied to each of the pair of coils within a current range corresponding to a set maximum current value so that thermal power consumed by the electromagnetic coil is maintained constant at thermal power corresponding to the set maximum current value.

DESCRIPTION OF THE INVENTION (1) According to an embodiment of the invention, there is provided a charged particle beam apparatus that includes a magnetic lens having an electromagnetic coil composed of a pair of coils, the charged particle beam apparatus including:

a setting unit that sets a maximum current value that defines a maximum magnetomotive force of the magnetic lens based on an operation of a user; and a current control unit that controls a current to be supplied to each of the pair of coils within a current range corresponding to a set maximum current value so that thermal power consumed by the electromagnetic coil is maintained constant at thermal power corresponding to the set maximum current value.

According to an embodiment of the invention, there is provided a control method of a charged particle beam apparatus that includes a magnetic lens having an electromagnetic coil composed of a pair of coils, the control method including:

a setting step of setting a maximum current value that defines a maximum magnetomotive force of the magnetic lens based on an operation of a user; and a current control step of controlling a current to be supplied to each of the pair of coils within a current range corresponding to a set maximum current value so that thermal power consumed by the electromagnetic coil is maintained constant at thermal power corresponding to the set maximum current value.

According to the above embodiments, the charged particle beam apparatus is configured to allow a user to set a maximum current value, suppresses unnecessary power consumption, and shortens time needed to reach thermal equilibrium upon the start of the apparatus by controlling a current supplied to a pair of coils within a current range corresponding to a set maximum current value so that thermal power consumption corresponding to the set maximum current value is maintained.

(2) In the above charged particle beam apparatus and method thereof, the setting unit may set the maximum current value based on an upper limit to an acceleration voltage, the upper limit being specified by an operation of a user.

Some embodiments of the invention are described in detail below with reference to the drawings. Note that the following embodiments do not unduly limit the scope of the invention as stated in the claims. In addition, all of the elements described below are not necessarily essential requirements of the invention.

Figure 1:
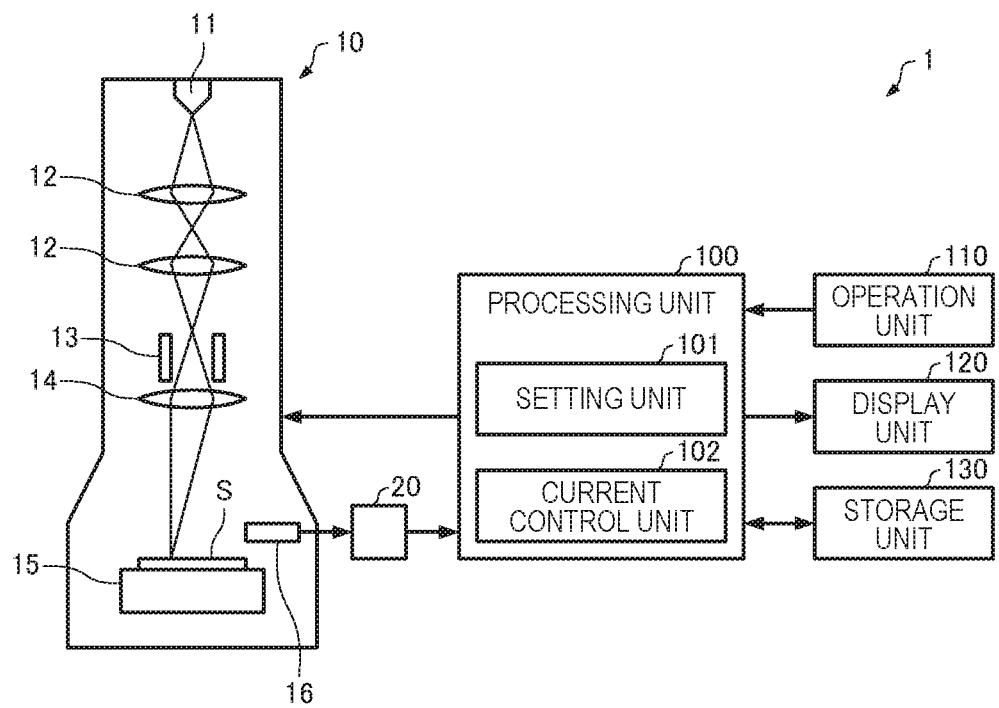
FIG. 1 schematically illustrates an example of a charged particle beam apparatus according to an embodiment of the invention.

FIG. 1 schematically illustrates an example of a configuration of a charged particle beam apparatus according to an embodiment of the invention. Here, a case in which the charged particle beam apparatus has a configuration of a scanning electron microscope (SEM) will be described. However, the charged particle beam apparatus according to the invention may have a configuration of a transmission electron microscope (TEM) or a scanning transmission electron microscope (STEM). A charged particle beam apparatus according to an embodiment of the invention may have a configuration in which a part of constituent elements (units) illustrated in FIG. 1 is omitted.

A charged particle beam apparatus 1 includes a charged particle beam apparatus body 10, a processing unit 100, an operation unit 110, a display unit 120, and a storage unit 130.

The charged particle beam apparatus body 10 includes an electron source 11, a condenser lens 12, a deflector 13, an objective lens 14, a specimen stage 15, and an electron detector 16.

The electron source 11 generates electron beams. For example, the electron source 11 is an electron gun that emits an electron beam by accelerating electrons released from a cathode by means of an anode.

The condenser lens 12 is a lens for focusing the electron beam emitted from the electron source 11 to form an electron probe. The condenser lens 12 can control a diameter of the electron probe (an electron beam diameter) and a probe current (an amount of irradiation current). The objective lens 14 is a lens arranged immediately before a specimen S and used for forming an electron probe. The condenser lens 12 and the objective lens 14 are magnetic lenses and at least one of the condenser lens 12 and the objective lens 14 is configured with an electromagnetic coil composed of a pair of coils.

The deflector (scanning coil) 13 deflects the electron probe (electron beam) formed by the condenser lens 12 and the objective lens 14. The deflector 13 is used for causing the electron probe to scan on the specimen S. Also, the deflector 13 is used for moving the electron probe to an arbitrary location on the specimen S to irradiate the location with the electron probe.

The specimen stage 15 holds the specimen S, moves the specimen S in a horizontal direction and a vertical direction, and rotates the specimen S around a vertical axis. The specimen stage 15 has a drive mechanism for moving and rotating the specimen S.

The electron detector 16 detects a secondary electron and a reflection electron emitted from the specimen S when the specimen S is irradiated (scanned) with the electron probe. An output signal (an intensity signal of the secondary electron and the reflection electron) from the electron detector 16 is amplified by an amplifier 20 and then supplied to the processing unit 100.

The operation unit 110 is for a user to input operation information, and the input operation information is output to the processing unit 100. The functions of the operation unit 110 can be realized by hardware such as a key board, a mouse, a button, a touch panel, and a touch pad.

The display unit 120 outputs an image generated by the processing unit 100. The functions of the display unit 120 can be realized by a touch panel that also functions as the operation unit 110, an LCD, a CRT, or the like.

The storage unit 130 holds a program that causes a computer to function as each unit of the processing unit 100 and various kinds of data. In addition, the storage unit 130 functions as a work area of the processing unit 100. The functions of the storage unit 130 can be realized by a hard disk drive, a RAM, or the like.

The processing unit 100 performs processing for controlling the charged particle beam apparatus body 10 (the electron source 11, the condenser lens 12, the deflector 13, the objective lens 14, and the specimen stage 15), processing for obtaining a scanning electron microscope image of the specimen S by imaging a detection signal amplified by the amplifier 20 in synchronism with a scan signal, and processing for display control, etc. The functions of the processing unit 100 can be realized by hardware such as various kinds of processors (a CPU, a DSP, etc.) and a program. The processing unit 100 includes a setting unit 101 and a current control unit 102.

The setting unit 101 sets a maximum current value which defines a maximum magnetomotive force of the objective lens 14 (the magnetic lens) based on an operation of the user (the operation information input through the operation unit 110). In addition, the setting unit 101 may set the maximum current value based on an upper limit of an acceleration voltage specified by an operation of the user. The processing unit 100 displays a setting screen for the user to specify the maximum current value and the upper limit to the acceleration voltage on the display unit 120.

The current control unit 102 controls a current to be supplied to each of the pair of coils composing the electromagnetic coil within a current range corresponding to the maximum current value set by the setting unit 101 by controlling the power of the magnetic lens (the condenser lens 12 and/or the objective lens 14) included in the charged particle beam apparatus body 10 so that thermal power consumed by the electromagnetic coil of the magnetic lens is maintained constant at thermal power corresponding to the maximum current value set by the setting unit 101.

Figure 2:
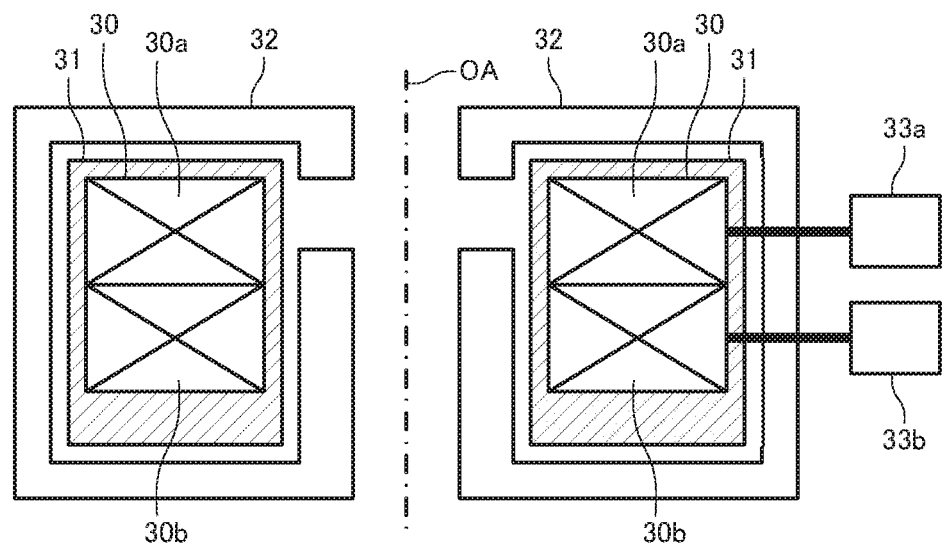
FIG. 2 is a cross-section diagram schematically illustrating an example of a configuration of a magnetic lens.

FIG. 2 is a cross-section diagram schematically illustrating an example of a configuration of a magnetic lens included in the charged particle beam apparatus body 10. The magnetic lens is configured to include an electromagnetic coil 30 composed of a pair of coils 30a and 30b each of which is formed with a lead wire wound, a cooling plate 31 for cooling the electromagnetic coil 30, and a yoke 32 arranged in such a manner to surround the electromagnetic coil 30. As illustrated in FIG. 2, the magnetic lens has a rotationally symmetrical shape and is configured such that an optical axis OA serves as a rotationally symmetrical axis and the electron beam passes near the optical axis OA. The yoke 32 is formed with a material having high permeability, such as iron, and a cutout (lens gap) is formed in a portion facing the optical axis OA. A power source 33a supplies a current to the coil 30a, and a power source 33b supplies a current to the coil 30b. The power sources 33a and 33b are both bipolar power sources, and outputs of the power sources 33a and 33b are controlled by the current control unit 102. While a case in which both of the power sources 33a and 33b are bipolar power sources will be described below, either the power source 33a or the power source 33b may be a bipolar power source. Magnetic field lines generated by supplying the electromagnetic coil 30 (the pair of coils 30a and 30b) with the current flow through the yoke 32, leaks from the cutout portion of the yoke 32 and generates a magnetic field, and provides a lens effect on the electron beam passing near the optical axis OA.

Each of the pair of coils 30a and 30b is assumed to be formed with the same winding number n, and a resistance value of the coils 30a and 30b is represented as r. When a value of the current supplied to the coil 30a is represented as $i_1$ and a value of the current supplied to the coil 30b is represented as $i_2$, a magnetomotive force $J_1$ of the coil 30a is expressed by $J_1 = n \times i_1$ and a magnetomotive force $J_2$ of the coil 30b is expressed by $J_2 = n \times i_2$. In addition, when a value of the current supplied to the electromagnetic coil 30 is represented as i, a magnetomotive force J of the magnetic lens is expressed by $J = n \times i$.

Here, when a maximum magnetomotive force of the magnetic lens is represented as $J_{max}$, a current value max that obtains $J_{max} = n \times i_{max}$ is defined as a maximum current value.

The current values $i_1$ and $i_2$ needed to obtain the maximum magnetomotive force $J_{max}$ is expressed with a maximum current value $i_{max}$ as follows:

$$i_1 = i_2 = i_{max}/2$$

In this case, thermal powers $P_1$ and $P_2$ (joule heat generated by the coils 30a and 30b) consumed by the coils 30a and 30b are respectively expressed by:

$$P_1 = r \times i_1^2 = r \times (i_{max}/2)^2 = r \times i_{max}^2/4$$

$$P_2 = r \times i_2^2 = r \times (i_{max}/2)^2 = r \times i_{max}^2/4$$

Thermal power P consumed by the electromagnetic coil 30 is expressed by:

$$P = r \times i_{max}^2/4 + r \times i_{max}^2/4 = r \times i_{max}^2/2$$

The current control unit 102 controls the current values $i_1$ and $i_2$ supplied to the coils 30a and 30b, respectively, so that the thermal power P consumed by the electromagnetic coil 30 is maintained constant at $r \times i_{max}^2/2$ (the thermal power corresponding to the maximum current value $i_{max}$). Specifically, the current values $i_1$ and $i_2$ are obtained by the following expression (1) by using the current value i obtained from the necessary magnetomotive force J of the magnetic lens (i=J/n) and the maximum current value $i_{max}$.

$$i_1 = \frac{i + \sqrt{i_{max}^2 - i^2}}{2} \qquad (1)$$

$$i_2 = \frac{i - \sqrt{i_{max}^2 - i^2}}{2}$$

By performing the current control based on the expression (1), the thermal power P consumed by the electromagnetic coil 30 is maintained at a constant value ($r \times i_{max}^2/2$), and by controlling the current values $i_1$ and $i_2$ supplied to the coils 30a and 30b, respectively, within a current range corresponding to the maximum current value $i_{max}$ (the current value $i_1$ is within a range from $-i_{max}/2$ to $i_{max}/\sqrt{2}$, and the current value $i_2$ is within a range from $-i_{max}/\sqrt{2}$ to $i_{max}/2$), the magnetomotive force J of the magnetic lens can be varied within a range from $-J_{max}$ to $J_{max}$.

Figure 3:
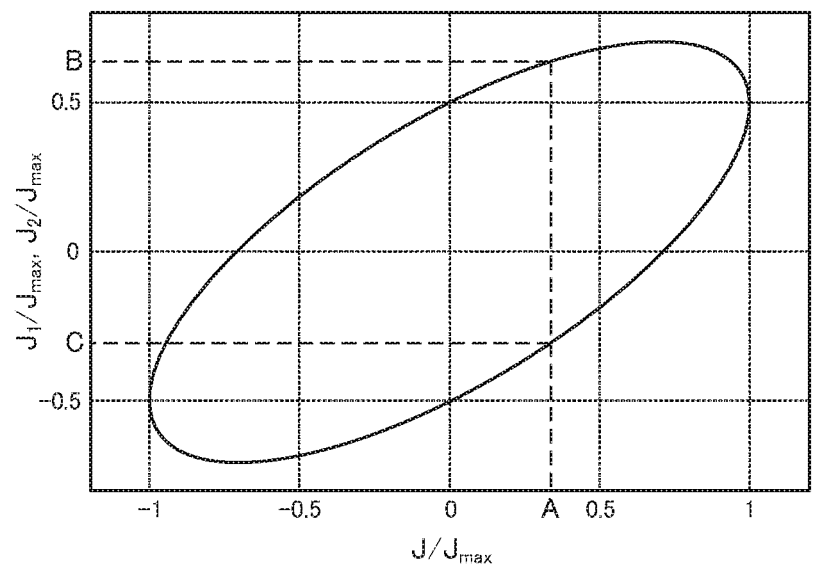
FIG. 3 is a graph in which a relationship between a magnetomotive force of a magnetic lens and a magnetomotive force of each of a pair of coils is plotted.

FIG. 3 is a graph in which a relationship between the magnetomotive force J of the magnetic lens and the magnetomotive forces $J_1$ and $J_2$ of the pair of coils 30a and 30b is plotted. The horizontal axis in the graph illustrated in FIG. 3 represents a value obtained by normalizing the magnetomotive force J of the magnetic lens by the magnetomotive force $J_{max}$, and the vertical axis therein represents a value obtained by normalizing the magnetomotive forces $J_1$ and $J_2$ of the coils 30a and 30b by the magnetomotive force $J_{max}$. As illustrated in FIG. 3, by performing the current control such that the magnetomotive forces $J_1$ and $J_2$ of the coils 30a and 30b draw an elliptical locus, thermal power P consumed by the electromagnetic coil 30 can be maintained at a constant value. For example, when the necessary magnetomotive force J of the magnetic lens (the normalized magnetomotive force $J/J_{max}$) is a value represented by A in FIG. 3, the current value $i_1$ is controlled such that the magnetomotive force $J_1$ of the coil 30a (the normalized magnetomotive force $J_1/J_{max}$) becomes a value represented by B in FIG. 3 and the current value $i_2$ is controlled such that the magnetomotive force $J_2$ of the coil 30b (the normalized magnetomotive force $J_2/J_{max}$) becomes a value represented by C in FIG. 3. When the magnetomotive force J of the magnetic lens is variable within a range from 0 to $J_{max}$, since the magnetomotive force $J_1$ of the coil 30a does not need to be a negative value, only the power source 33b of the coil 30b needs to be a bipolar power source, and the power source 33a of the coil 30a may be a unipolar power source.

The charged particle beam apparatus 1 according to the above embodiment is configured to allow the user to set the maximum current value $i_{max}$. For example, the user may set the maximum current value $i_{max}$ by inputting an arbitrary value in the setting screen displayed on the display unit 120. Alternatively, a plurality of predetermined options for the maximum current value $i_{max}$ may be presented to the user, and the user may select and set the maximum current value $i_{max}$ from the plurality of options.

Figure 4:
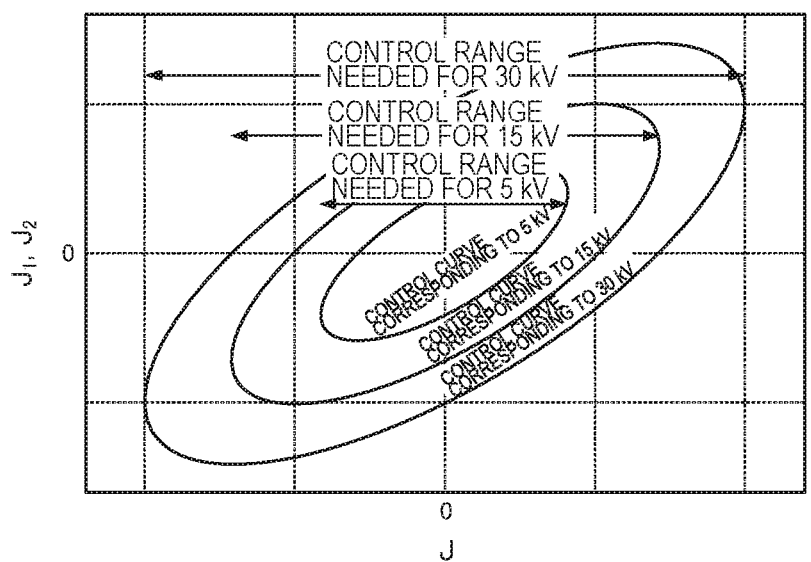
FIG. 4 illustrates an example of a screen presenting a plurality of options for an upper limit to an acceleration voltage.

Also in the setting screen, a plurality of predetermined options (for example, 30 kV, 15 kV, 5 kV, and 2 kV) for an upper limit to the acceleration voltage is presented to the user, and the maximum current value $i_{max}$ may be set based on the upper limit to the acceleration voltage selected (specified) from the plurality of options by the user. For example, the maximum current value $i_{max}$ for each of the plurality of upper limits to the acceleration voltage is stored in the storage unit 130 as table information in advance, and the setting unit 101 refers to the table information and sets the maximum current value $i_{max}$ that corresponds to the upper limit of the acceleration voltage selected by the user. The maximum current value $i_{max}$ that corresponds to the upper limit of the acceleration voltage is determined based on the role that the magnetic lens plays in the charged particle beam apparatus (in the above embodiment, whether the magnetic lens is used as the objective lens or the condenser lens) and the mechanical structure of the magnetic lens, and the lower the upper limit of the acceleration voltage is, the smaller the corresponding maximum current value $i_{max}$ becomes. When the plurality of options for the upper limit to the acceleration voltage is presented to the user, as illustrated in FIG. 4, control curves (curves each of which plots a relationship between the magnetomotive force J of the magnetic lens and the magnetomotive forces $J_1$ and $J_2$ of the pair of coils 30a and 30b) corresponding to the respective upper limits of the acceleration voltage may be displayed on the display unit 120. In this example, the control curves corresponding to 30 kV, 15 kV, and 5 kV are represented as the plurality of options for the upper limit to the acceleration voltage. Alternatively, a plurality of options for a limit set to the electron beam diameter, instead of the acceleration voltage, may be presented to the user, and the maximum current value $i_{max}$ may be set based on the limit value to the electron beam diameter selected by the user. If the charged particle beam apparatus is a transmission electron microscope, a plurality of options for a limit set to the observation magnification may be presented to the user, and the maximum current value $i_{max}$ may be set based on the limit value to the observation magnification selected by the user.

The current control unit 102 calculates the current values $i_1$ and $i_2$ supplied to the coils 30a and 30b, respectively, based on the expression (1) by using the maximum current value $i_{max}$ set by the setting unit 101 and the current value i based on the necessary magnetomotive force J needed depending on the observation condition (such as the acceleration voltage). If the maximum current value $i_{max}$ is set based on the upper limit to the acceleration voltage specified by the user, it is preferable in view of stable operation of the apparatus to, during the actual operation, prohibit setting the acceleration voltage to a value higher than the specified upper limit to the acceleration voltage. However, if the diversity of operation is given greater importance than the stable operation, an option that allows to set a value higher than the upper limit may be prepared.

According to the above embodiment, by having the configuration that allows the user to set the maximum current value $i_{max}$ and controlling the current values $i_1$ and $i_2$ supplied to the pair of coils 30a and 30b, respectively, within the current range (from $-i_{max}/\sqrt{2}$ to $i_{max}/\sqrt{2}$) corresponding to the set maximum current value $i_{max}$ so that thermal power consumption ($r \times i_{max}^2/2$) corresponding to the set maximum current value $i_{max}$ is maintained, unnecessary power consumption is suppressed, and time needed to reach thermal equilibrium upon the start of the apparatus can be shortened. Namely, when the magnetic lens does not need a large magnetomotive force, such as the case where the charged particle beam apparatus is operated at a low acceleration voltage, by allowing the user to set a low value as the maximum current value $i_{max}$ (for example, the upper limit to the acceleration voltage defining the maximum current value $i_{max}$), the thermal power consumption of the electromagnetic coil is reduced, and wasteful power consumption can be prevented. In addition, since the temperature rise of the electromagnetic coil and the peripheral members thereof can be suppressed to a low level, standby time needed until the temperature of the electromagnetic coil and the temperature of the peripheral members reach thermal equilibrium and the drift is sufficiently reduced can be shortened. The above current control may be performed on a part of the plurality of magnetic lenses included in the charged particle beam apparatus or on all the magnetic lenses included in the charged particle beam apparatus.

The above embodiment has described the case in which two coils formed separately are combined together and used as a pair of coils that compose the electromagnetic coil. However, as the pair of coils that compose the electromagnetic coil, coils created by winding two lead wires in parallel at the same time (bifilar winding) may be used.

The invention is not limited to the above embodiments thereof and thus it can be implemented in many various modifications. The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

The invention claimed is:
1. A charged particle beam apparatus comprising:
a magnetic lens having an electromagnetic coil composed of a pair of coils;
an operation unit configured to allow a user to enter a maximum current value that defines a maximum magnetomotive force of the magnetic lens through an operation of the user by selecting the maximum current value from a plurality of predetermined options for the maximum current value presented to the user;

a setting unit that sets the maximum current value that defines the maximum magnetomotive force of the magnetic lens based on the operation of the user; and a current control unit that controls a current to be supplied to each of the pair of coils within a current range corresponding to a set maximum current value so that thermal power consumed by the electromagnetic coil is maintained constant at thermal power corresponding to the set maximum current value, wherein the current to be supplied to each of the pair of coils $i_1$ and $i_2$ is obtained by the following expression (1) by using a current value i obtained from a necessary magnetomotive force J of the magnetic lens (i=J/n) and the set maximum current value ($i_{max}$):

$$i_1 = \frac{i + \sqrt{i_{max}^2 - i^2}}{2} \quad (1)$$

$$i_2 = \frac{i - \sqrt{i_{max}^2 - i^2}}{2}.$$

2. The charged particle beam apparatus according to claim 1, wherein
the setting unit sets the maximum current value based on an upper limit to an acceleration voltage, the upper limit being specified by an operation of the user.

3. A control method of a charged particle beam apparatus that includes a magnetic lens having an electromagnetic coil composed of a pair of coils, the control method comprising:

an entry step of entering a maximum current value that defines a maximum magnetomotive force of the magnetic lens through an operation of the user by selecting the maximum current value from a plurality of predetermined options for the maximum current value presented to the user;

a setting step of setting the maximum current value that defines the maximum magnetomotive force of the magnetic lens based on the operation of the user; and a current control step of controlling a current to be supplied to each of the pair of coils within a current range corresponding to a set maximum current value so that thermal power consumed by the electromagnetic coil is maintained constant at thermal power corresponding to the set maximum current value, wherein the current to be supplied to each of the pair of coils $i_1$ and $i_2$ is obtained by the following expression (1) by using a current value i obtained from a necessary magnetomotive force J of the magnetic lens (i=J/n) and the set maximum current value ($i_{max}$):

$$i_1 = \frac{i + \sqrt{i_{max}^2 - i^2}}{2} \quad (1)$$

$$i_2 = \frac{i - \sqrt{i_{max}^2 - i^2}}{2}.$$

* * * * *

UNITED STATES PATENT AND TRADEMARK OFFICE
CERTIFICATE OF CORRECTION

PATENT NO. : 11,640,894 B2
APPLICATION NO. : 16/682421
DATED : May 2, 2023
INVENTOR(S) : Toshikatsu Kaneyama It is certified that error appears in the above-identified patent and that said Letters Patent is hereby corrected as shown below:

In the Claims

Column 9, Lines 13-14, Claim 1, delete "$i_1$ and $i_2$" and insert -- ($i_1$ and $i_2$) --

Column 10, Lines 18-19, Claim 3, delete "$i_1$ and $i_2$" and insert -- ($i_1$ and $i_2$) --

Signed and Sealed this
Seventeenth Day of October, 2023

Katherine Kelly Vidal
*Director of the United States Patent and Trademark Office*